(12) United States Patent
Nayebi et al.

(10) Patent No.: US 6,304,132 B1
(45) Date of Patent: Oct. 16, 2001

(54) HIGH SIDE CURRENT SOURCE CIRCUIT HAVING IMPROVED OUTPUT IMPEDANCE TO REDUCE EFFECTS OF LEAKAGE CIRCUIT

(75) Inventors: Mehrdad Nayebi, Palo Alto; Stephen D. Edwards, San Jose; Phil Shapiro, Palo Alto, all of CA (US)

(73) Assignees: Sony Corporation of Japan, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 09/183,321

(22) Filed: Oct. 30, 1998

(51) Int. Cl.$^7$ ........................................ G05F 1/10
(52) U.S. Cl. .................... 327/540; 327/538; 323/316
(58) Field of Search .................... 327/538, 540, 327/541, 543; 323/316

(56) References Cited

U.S. PATENT DOCUMENTS

| | | | |
|---|---|---|---|
| 4,595,874 | * | 6/1986 | Hein et al. ............................. 323/312 |
| 5,319,303 | * | 6/1994 | Yamada ................................. 323/316 |
| 5,341,087 | * | 8/1994 | Van Leeuwen ...................... 323/316 |
| 5,493,205 | * | 2/1996 | Gorecki ................................ 323/316 |
| 5,614,867 | * | 3/1997 | Cotreau ................................ 323/316 |
| 5,831,471 | * | 11/1998 | Nakajima et al. .................... 327/540 |

* cited by examiner

Primary Examiner—Terry D. Cunningham
(74) Attorney, Agent, or Firm—Wagner, Murabito & Hao LLP

(57) ABSTRACT

A high side low voltage current source circuit having improved output impedance to reduce effects of leakage current. A current source circuit is described with a transistor having an emitter coupled to an emitter degeneration resistor which is coupled to a power supply voltage. The output of the current source is taken at the collector of the transistor. In one embodiment, the transistor is a PNP transistor device. The base of the transistor is coupled to the output of an operational amplifier. One input of the operational amplifier is coupled in a feedback loop to the emitter of the transistor. A direct current bias voltage is applied to the other input of the operational amplifier. The output impedance (R"o) of the current is source is based on the open loop gain of the operational amplifier (e.g., about 35 dB) and is therefore orders of magnitude larger than the output impedance of other prior art current source designs. Also included is a novel level shifting circuit for shifting (up) the DC voltage level at the emitter of the transistor to improve its dynamic range of operation in low power supply voltage environments. A resistor is also placed in a tail current path of the operational amplifier, rather than a transistor, to further improve the dynamic range of the current source. The present invention finds particular application within a clock generator circuit where its reduced leakage current properties and improved dynamic range help to reduce clock jitter.

17 Claims, 8 Drawing Sheets

200

HIGH SIDE CURRENT SOURCE CIRCUIT HAVING IMPROVED OUTPUT IMPEDANCE TO REDUCE EFFECTS OF LEAKAGE CIRCUIT

BACKGROUND OF THE INVENTION

1. Field of the Invention

The present invention relates to the field current source circuits. More particularly, the present invention relates to current source circuits characterized by having increased output impedance.

2. Related Art

High speed digital systems, such as engineering workstations and personal computers, require clock sources that have low jitter and low phase lock loop (PLL) bandwidths. Phase jitter in a system clock reduces the effective clock speed of the workstation or personal computer. More processing performance is gained, for a given clock rate, if the clock signal has less jitter. The PLL circuitry typically contains a voltage controlled oscillator (VCO) that receives a voltage level maintained by filter components. Normally, charging currents and voltage controlled oscillator gains are so high that externally situated filter components are required to achieve the low jitter and bandwidth requirements. However, external, e.g., "off-chip," filter components (e.g., capacitors, etc.) increase the overall cost of the digital system in part by making manufacturing more complex, but also by increasing the physical size of the digital system. Further, off-chip filter components also decrease system reliability by increasing the phase jitter by allowing external noise to be injected into the clock circuit through the PLL filter. Clock jitter is reduced if external elements of the PLL loop filter can be eliminated. To integrate filter components "on-chip," it is necessary to use smaller sized filter components. However, this leads to tighter filter leakage requirements because smaller sized capacitors are more sensitive to changes in current when compared to larger sized capacitors.

It is desired to reduce the effects of leakage current within a PLL circuit because, as discussed above, on-chip filter components are very sensitive to small leakage currents. PLL filters are normally driven by current source circuits and require outputs having very high impedance. A problem exists in eliminating off-chip filters and placing them on-chip. Namely, reducing the size of the filters (thereby allowing them to be placed on-chip) unfortunately also makes these components more sensitive to leakage current which impedes the ideal operation of certain PLL circuits. As a result, it is desired to use current sources that have reduced leakage current to drive differential filters for higher PLL accuracy. At the same time, this circuitry needs to operate from increasingly lower power supply voltages, e.g., to accommodate hand-held and other portable battery operated applications.

In operation, a PLL circuit injects current into filter components to establish a voltage at the input of a voltage controlled oscillator circuit in order to alter the frequency of oscillation of the PLL. This current is then ideally held constant over a long period of time (e.g., a "hold time") to maintain the oscillation frequency. Leakage across the filter component during the hold time, which exists between PLL correction pulses, will charge the filter component thereby changing its voltage. This changing voltage causes time jitter in the clock frequency because it changes the input voltage to the internal voltage controlled oscillator circuit. Therefore, it is necessary to reduce leakage current associated with the PLL filter component in order to provide an accurate oscillation frequency.

One method for reducing leakage current associated with the PLL filter component is to increase the output impedance, Ro, of the current source which supplies current to the PLL filter component, e.g., a capacitor.

FIG. 1 illustrates a single transistor prior art embodiment of a current source circuit 10. The transistor 14 has its emitter (E) coupled to a power supply 12, its base (B) coupled to a DC bias voltage 20 and its collector (C) coupled to output node 30 of the current source circuit 10. As shown, the output node 30 of the current source circuit 10 is also coupled to an exemplary voltage load 16 which is coupled to ground 18. The dashed element 32 is not a physical component but merely models the output impedance, Ro, of the current source circuit 10. In this configuration, the output impedance, Ro, is a function of the early voltage (Ve) of the transistor 14 divided by the current, Ic, through the transistor 14 and is represented by:

$$Ro=Ve/Ic=(kT/q)/Ic$$

where k, T and q are well known values defined by the physics of the transistor 14. In a typical case, Ve is 6 volts and Ic is 20 uA so Ro is approximately 300 K ohms as shown by:

$$Ro=6 \text{ volts}/20 \text{ uA}=300 \text{ K ohms}.$$

In the general case, Ro can vary higher or lower by a factor of two (or more) for the current source circuit 10 as shown in FIG. 1.

FIG. 2 illustrates another art implementation 50 which improves the output impedance of the current source circuit. The improvement is gained by the addition of an emitter degeneration resistor, RE, 26. Resistor 26 is placed between the voltage supply 12 and the emitter (E) of transistor 14. Some of the extra current injected by a change in collector voltage at (C) is reinjected through the emitter (E) and this current partially cancels the extra current. Therefore, the fraction of the extra current reinjected depends on the ratio of 1/gm to RE. In this configuration, the output impedance, R'o, of current source circuit 50 is expressed as:

$$R'o=Ro(1+gm*RE)$$

where Ro is the output impedance of current source circuit 10 of FIG. 1 and gm is a well known constant defined by the physics of transistor 14. Assuming RE is on the order of 1K ohm resistance, and gm is approximately $1 \times 10^{-4}$, then the output impedance, R'o, of the current source circuit 50 becomes:

$$R'o=Ro(1+0.8)=1.8*Ro.$$

Although the value of R'o represents approximately an 80% increase in output impedance over the output impedance of the current source circuit 10 of FIG. 1, a current source having a higher output impedance would even further reduce the effects of leakage current.

SUMMARY OF THE INVENTION

Accordingly, what is needed is a current source circuit having a higher output impedance than realized by the prior art current source circuits described above. What is further needed is a high side current source circuit (e.g., one coupled to the voltage supply) having a higher output impedance than realized by the prior art current source circuits described above. What is also needed is a high side current source circuit having a higher output impedance than realized by the prior art current source circuits described above that can also effectively operate within a low power supply voltage environment. Such a current source can advantageously be used to charge an integrated circuit capacitor. The present invention provides these advantageous capabilities.

A high side low voltage current source circuit is described having improved output impedance to reduce effects of leakage current. The present invention includes a current source circuit having a transistor with its emitter coupled to an emitter degeneration resistor which is coupled to a power supply voltage. The output of the current source is taken at the collector of the transistor. In one embodiment, the transistor is a PNP transistor device. The base of the transistor is coupled to the output of an operational amplifier. One input (e.g., the negative input) of the operational amplifier is coupled in a feedback loop to the emitter of the transistor. A direct current bias voltage is applied to the other input (e.g., the positive input) of the operational amplifier. In this arrangement, the output impedance (R") of the current is source is based on the open loop gain of the operational amplifier (e.g., about 35 dB) and is therefore orders of magnitude larger than the output impedance of other prior art current source designs.

The feedback loop and the operational amplifier act to hold constant the current flowing through the emitter of the transistor thereby reducing leakage current. The present invention also offers a novel level shifting circuit for shifting (up) the DC voltage level at the emitter of the transistor to improve its dynamic range of operation in low power supply voltage environments. A resistor is also placed in a tail current path of the operational amplifier, rather than a transistor, to further improve the dynamic range of the current source. The present invention finds particular application within a clock generator circuit where its reduced leakage current properties and improved dynamic range help to provide a stable voltage controlled oscillator (VCO) circuit thereby acting to reduce clock jitter in the output clock signal.

In a clock generator circuit having a phase lock loop circuit, embodiments of the present invention specifically include a current source having a stable output current for maintaining a voltage at the input of a voltage controlled oscillator, the current source circuit comprising: an emitter degeneration resistor coupled to the high side of a supply voltage and coupled to a first node; a transistor device comprising: an emitter coupled to the first node; a collector coupled to an output node; and a base, wherein the current source circuit supplies current from the output node; an operational amplifier circuit having an output coupled to the base of the transistor device, the operational amplifier circuit also having a first input and a second input, the first input coupled to the first node to provide a feedback loop, the operational amplifier circuit for maintaining constant any current flowing through the transistor device to provide a high output impedance for the current source circuit; and a bias voltage applied to the second input of the operational amplifier circuit wherein the high output impedance of the current source circuit is based on an open loop gain of the operational amplifier circuit.

Embodiments include the above and wherein the supply voltage is a low voltage supply and wherein further the operational amplifier circuit comprises a level shifting circuit coupled to the first node of the transistor device, the level shifting circuit comprising: a resistor coupled to the high side of the supply voltage; a PNP transistor having an emitter coupled to the resistor; and a NPN transistor coupled to a base of the PNP transistor and having a base coupled to the first node, the level shifting circuit for increasing the dynamic voltage range of the current source circuit by increasing a direct current (DC) voltage at the first node. Embodiments also include the above wherein the clock generation circuit includes an integrated circuit (IC) capacitor element and wherein the output node is coupled for charge the IC capacitor element.

DETAILED DESCRIPTION OF THE INVENTION

In the following detailed description of the present invention, a high side, low power, current source having improved output impedance for reducing effects of leakage current, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Figure 3:
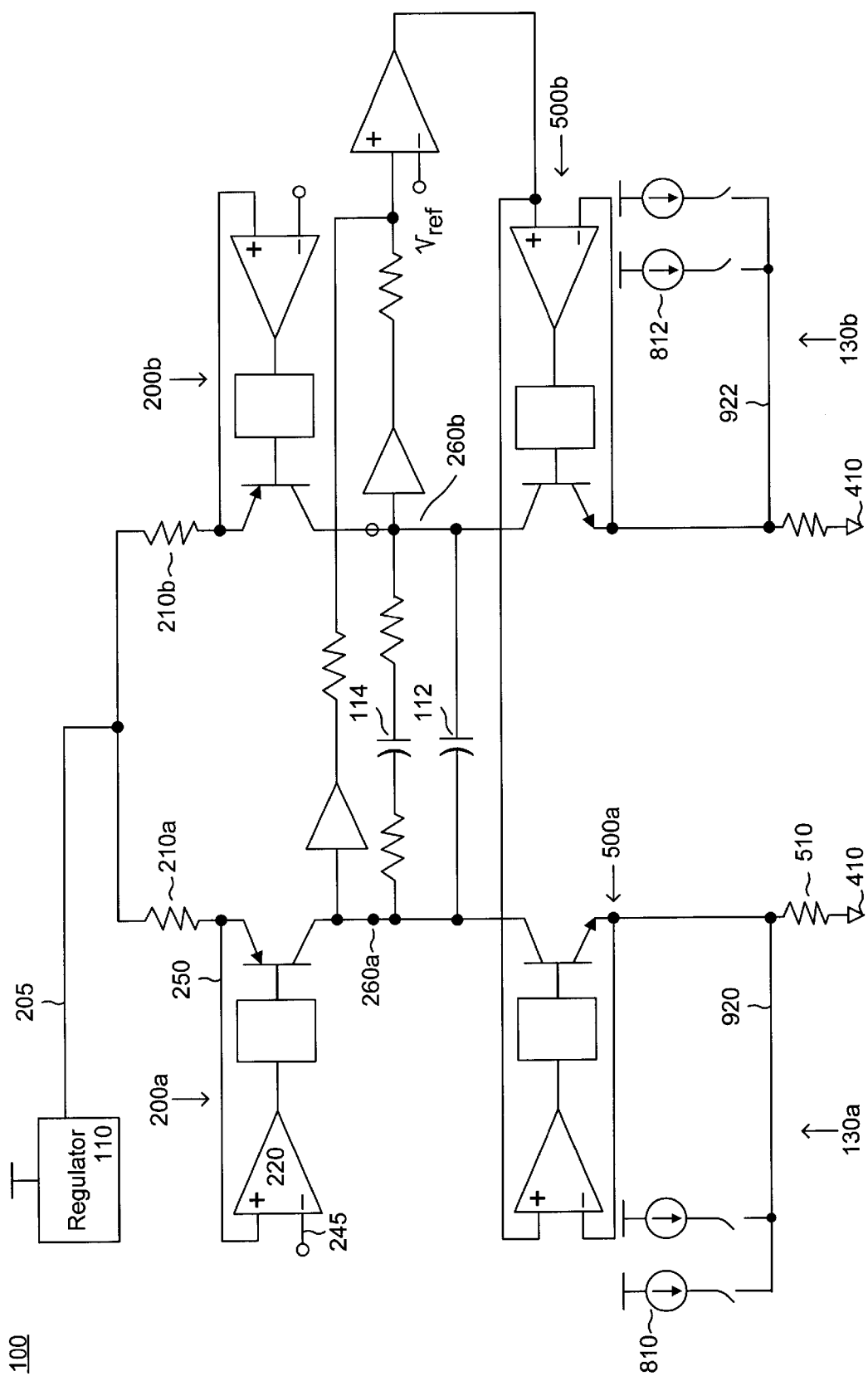
FIG. 3A is a logical block diagram of a clock generation circuit in which the present invention can be implemented.
FIG. 3B illustrates phase lock loop implemented clock signal generator using the high side current source circuit of the present invention.

FIG. 3A is a logical block diagram of a clock generator circuit 962 in which embodiments of the present invention can be implemented. Clock generator circuit 962 includes an oscillator 966 that generates an input frequency (fin) at 966. A phase frequency detector (PFD) circuit 952 is coupled to receive frequency 966 and is coupled to a divider circuit 958 which receives an external divider control signal 970. The PFD circuit 952 is coupled to a filter circuit 954 which is also coupled to a voltage controlled oscillator (VCO) circuit 956 which is coupled in feedback to the divider circuit 958. The filter 954 and the VCO circuit 956 are coupled to receive power from a regulator 110 which is coupled to a power supply. The output of the VCO circuit 956 generates the output clock frequency (fo) at 964.

FIG. 3B illustrates in more detail a clock generation circuit 100 as one example in which the current source circuit of the present invention can operate. The high-side large output impedance current source design of the present invention can operate in conjunction with a variety of different circuit systems where Ro cancellation is required, e.g., within a digital to analog converter circuit or within an operational amplifier circuit. Therefore, it is appreciated that the clock generation circuit 100 is only one example of such a circuit system.

Specifically, clock generation circuit 100 of FIG. 3B contains a phase lock loop circuit having a differential circuit configuration. Circuit 100 is implemented "on chip," that is, a single integrated circuit chip is used to realize circuit 100. The high side of a power supply voltage is coupled to regulator 110. Although the high side voltage can be of a wide range of voltages, in one embodiment the high side voltage is approximately within the range of 2.7 to 3.3 volts. The regulator 110 is coupled via line 205 to two ends of a differential circuit configuration having differential side 130a and differential side 130b. Each differential side include a current source circuit (e.g., 200a) and a current sink circuit (e.g., 500a). Voltage supply line 205 is coupled to resistors 210a and 210b. Resistor 210a is coupled to the other components of current source 200a of the present invention. Current source 200b, also of the design of the present invention includes resistor 210b. As described in more detail below, current source 200a contains a feedback loop 250 and an operational amplifier circuit 220 which receives a direct current (DC) bias voltage at its (−) input 245 and a feedback loop 250 at its (+) input. A charge pump injects current over line 920.

Current sink circuits 500a and 500b are described in co-pending U.S. patent application Ser. No. 09/183,452, concurrently filed herewith, entitled "Low Side Current Sink Circuit Having Improved Output Impedance to Reduce Effects of Leakage Current," by Nayebi et al., attorney docket number SONY-50M2407 and assigned to the assignee of the present invention.

The current sources 200a and 200b are used, in one embodiment, in combination with current sink circuits 500a and 500b, to maintain current through filter elements 112 and 114. Charge pumps 810 and 812 inject additional current to thereby establish a differential voltage across the filter elements 112 and 114. Filter components 112 and 114 are integrated circuit capacitors and as such they are integrated within the IC chip of circuit 100. The differential voltage is used as an input to a voltage controlled oscillator circuit of the phase lock loop circuit within clock generation circuit 106. It is desired to provide a stable voltage at the input of the voltage controlled oscillator circuit in order to reduce clock jitter within clock generation circuit 100. One way that the voltage can change across the filter elements 112 and 114 is as a result of current fluctuations in the current injected from current sources 200a and 200b.

Specifically, leakage current across the filter elements 112 and 114 charges the filter elements 112 and 114 thereby changing their differential voltage. In circuit 100, the filter elements, e.g., capacitors 112 and 114, are designed to be small internal "on-chip" devices (having correspondingly small capacitance values). As a result, the voltage level across these small filter elements 112 and 114 is very sensitive to small changes in the injected currents at nodes 260a and 260b. The changing differential voltage across filter elements 112 and 114 causes time jitter in circuit 100 because it causes changes in the input voltage of the voltage controlled oscillator.

Buffer circuits 300a and 300b sample the voltage over the filter elements. Buffer circuits contain a high input impedance buffer circuit as described in patent application Ser. No. 09/183,198, concurrently filed herewith, entitled "High Input Impedance Buffer Circuit," by Nayebi et al., attorney docket number SONY-50M2411 and assigned to the assignee of the present invention.

Therefore, in accordance with the design of the present invention, the current supplied from current sources 200a and 200b is very stable once it is set to a desired level and held there over time. In accordance with the present invention, by reducing leakage current, the filter elements 112 and 114 maintain a stable differential voltage level. In operation, the current supplied from current sources 200a and 200b is adjusted to set a particular operational frequency of clock generation circuit 100 and then held over a hold period. Hold periods are situated in between phase lock loop correction pulses. The present invention advantageously reduces the effects of leakage current as one way to stabilize the current supplied from current sources 200a and 200b during the hold periods. The effects of leakage current are reduced, in accordance with the present invention, by establishing a high output impedance, R"o, for current sources 200a and 200b. The same is done with respect to the current sinks 500a and 500b. By using current sources 200a and 200b that have high output impedance, leakage current is reduced thereby providing a stable input voltage to the voltage controlled oscillator of the phase lock loop circuit. The stable input voltage thereby reduces jitter in the output clock signal of circuit 100.

Figure 4A:
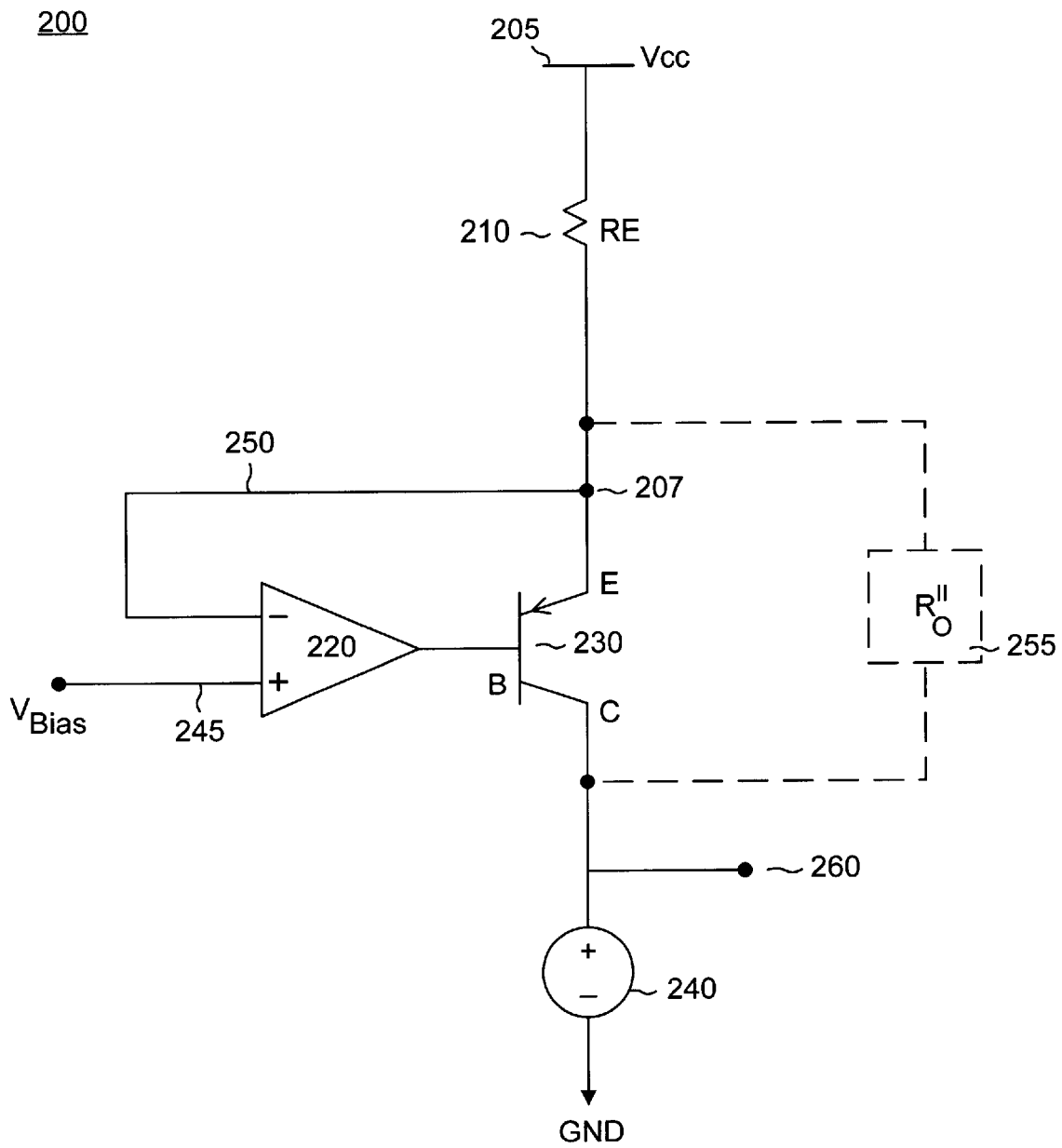
FIG. 4A illustrates a circuit block diagram of the high side current source circuit of the present invention having high output impedance.

FIG. 4A illustrates one embodiment of the high-side current source circuit 200 of the present invention. In accordance with the present invention, current source circuit 200 has a very high output impedance, R"o, shown as 255. Current source circuit 200 contains an emitter degeneration resistor, RE, 210 located in series between a low power supply voltage 205 and a first node 207. Circuit 200 include a transistor 230 having its emitter (E) coupled to the first node 207. Output current is supplied from the current source circuit 200 at node 260 which is coupled to the collector (C) of transistor 230. An exemplary load 240 is shown coupled to node 260, but this load 240 is not part of the current source 200 of the present invention.

The base (B) of transistor 230 is coupled to the output of an operational amplifier circuit 220. The negative (−) input of the operational amplifier circuit 220 is coupled via feedback loop 250 to the first node 207. The positive (+) input of the operational amplifier circuit 220 is coupled to a bias direct current (DC) voltage level over line 245 called Vbias. In this arrangement, the output impedance, R"o, is measured from node 207 to node 260 as shown by the dashed element 255 which is not a structural element but rather a model of R"o. In one embodiment of the present invention, transistor 230 is a PNP transistor, Vcc 205 is approximately between 2.0 and 3.3 volts and RE is approximately 30 k ohms, although other configurations can be used.

The emitter and base of transistor 230 of FIG. 4A are in the feedback loop. Vbias at 245 is equal to the voltage at the emitter (E) of transistor 230 and these values are held relatively constant by circuit 230. That is, any change in the voltage at the emitter (E) of transistor 230 caused by leakage current is compensated for by the closed feedback loop thereby holding the voltage at node 207 constant. Circuit 200 dynamically compensates the voltage at node 207 over changes in load, temperature, etc.

Figure 4B:
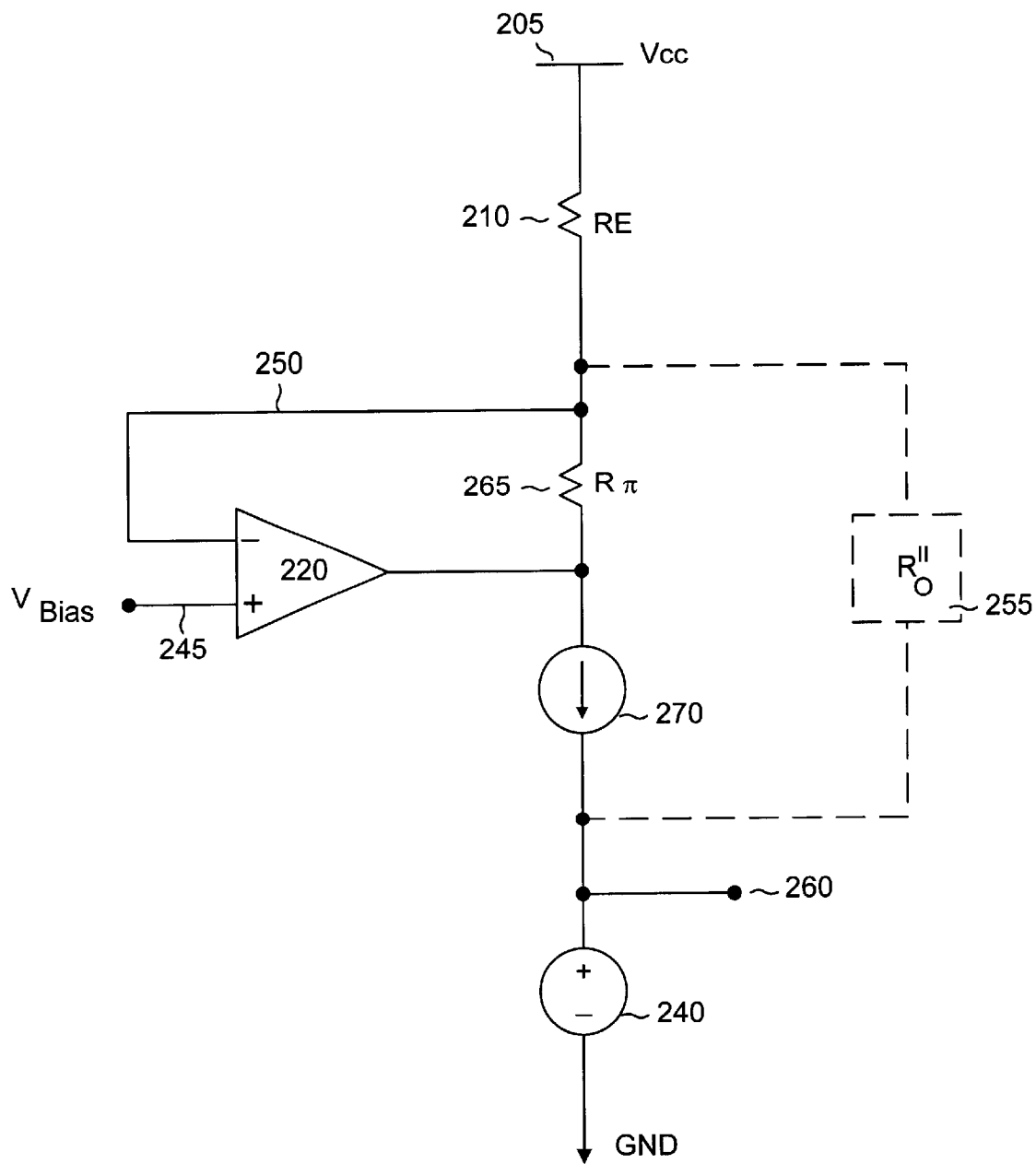
FIG. 4B is a circuit model of the high side current source circuit of FIG. 4A in accordance with the present invention.

FIG. 4B illustrates a circuit model of circuit 200 of FIG. 4A. In FIG. 4B, circuit 200 is the same as shown in FIG. 4A except the transistor 230 is modeled as a resistor, Rpi 265, and an ideal current source 270. Rpi is the input impedance and is equal to 1/gm where gm is a well known constant that is dependent on the physics of the transistor 230.

Figure 1:
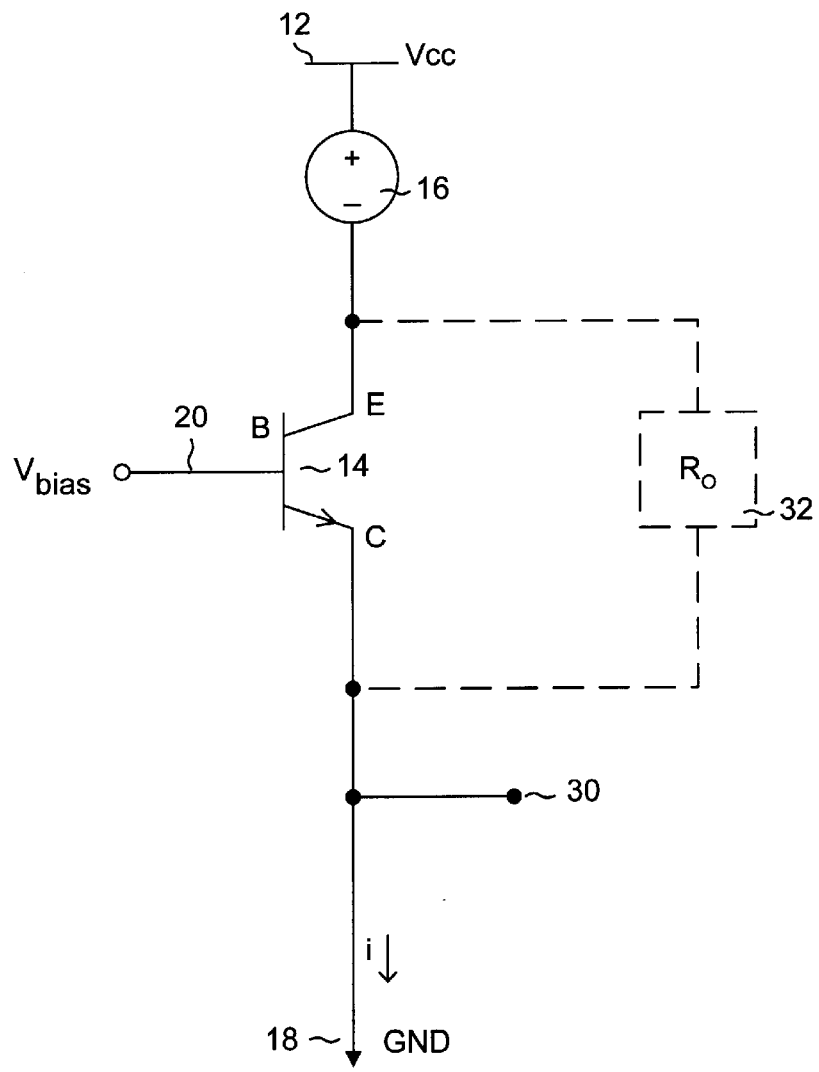
FIG. 1 illustrates a first high side current source of the prior art.
Figure 2:
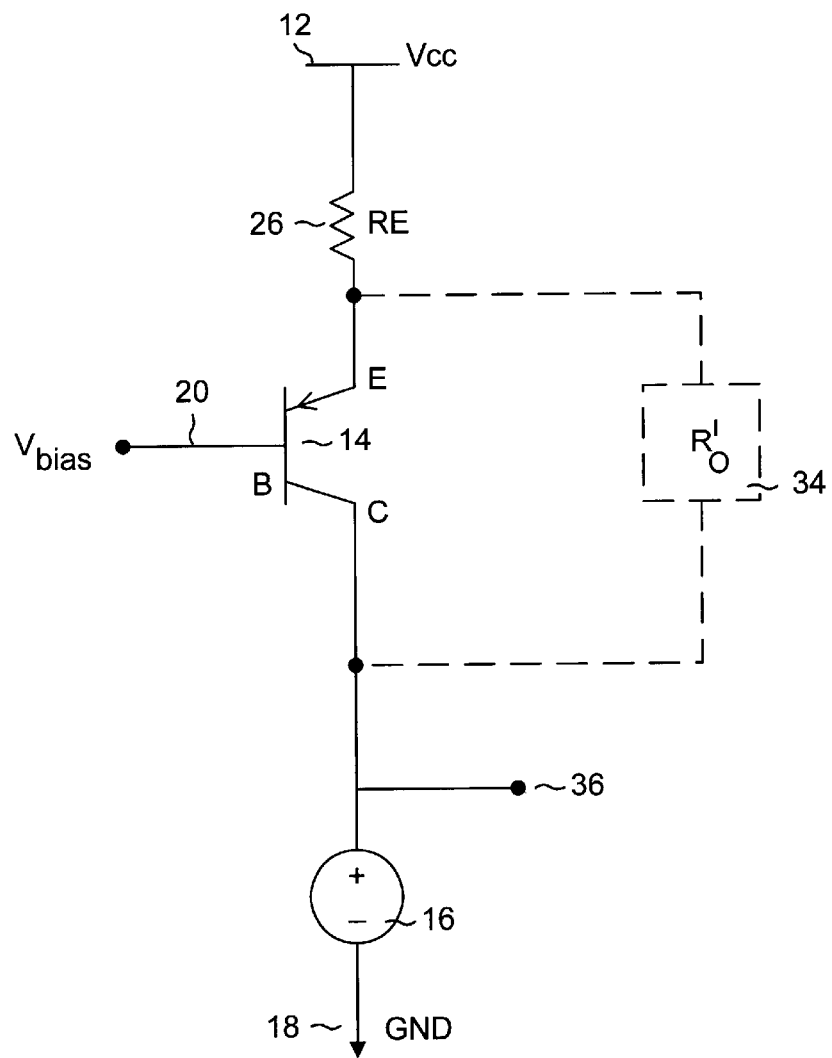
FIG. 2 illustrates a second high side current source of the prior art that has an emitter degeneration resistor for increased output impedance.

In the current source circuit 200 of FIG. 4A, as modeled in FIG. 4B, a large fraction of extra injected current is reinjected though the emitter (E) of transistor 230. The feedback loop 250 forces lower the impedance seen looking into the emitter (E) by 1/(the gain of the operational amplifier 220). This acts to multiply the fraction of current reinjected through the emitter (E) to increase by the operational amplifier gain. Therefore, the output impedance, R"o, of the current source circuit 200 of the present invention is equal to:

$$R"o = Ro(RE*Rpi)(A+1)$$

where RE is the resistance of resistor RE, Rpi is 1/gm, A is the open loop gain of operational amplifier 220 and Ro is the output impedance of the current source circuit of FIG. 1. In one embodiment of the present invention, the open loop gain, A, is very large and on the order of 35 dB. Therefore, the present invention provides a current source circuit 200 having an output impedance that is orders of magnitude greater than the output impedances of the current sources of FIG. 1 and FIG. 2. This effectively reduces the effects of leakage current from the current source 200.

Figure 5:
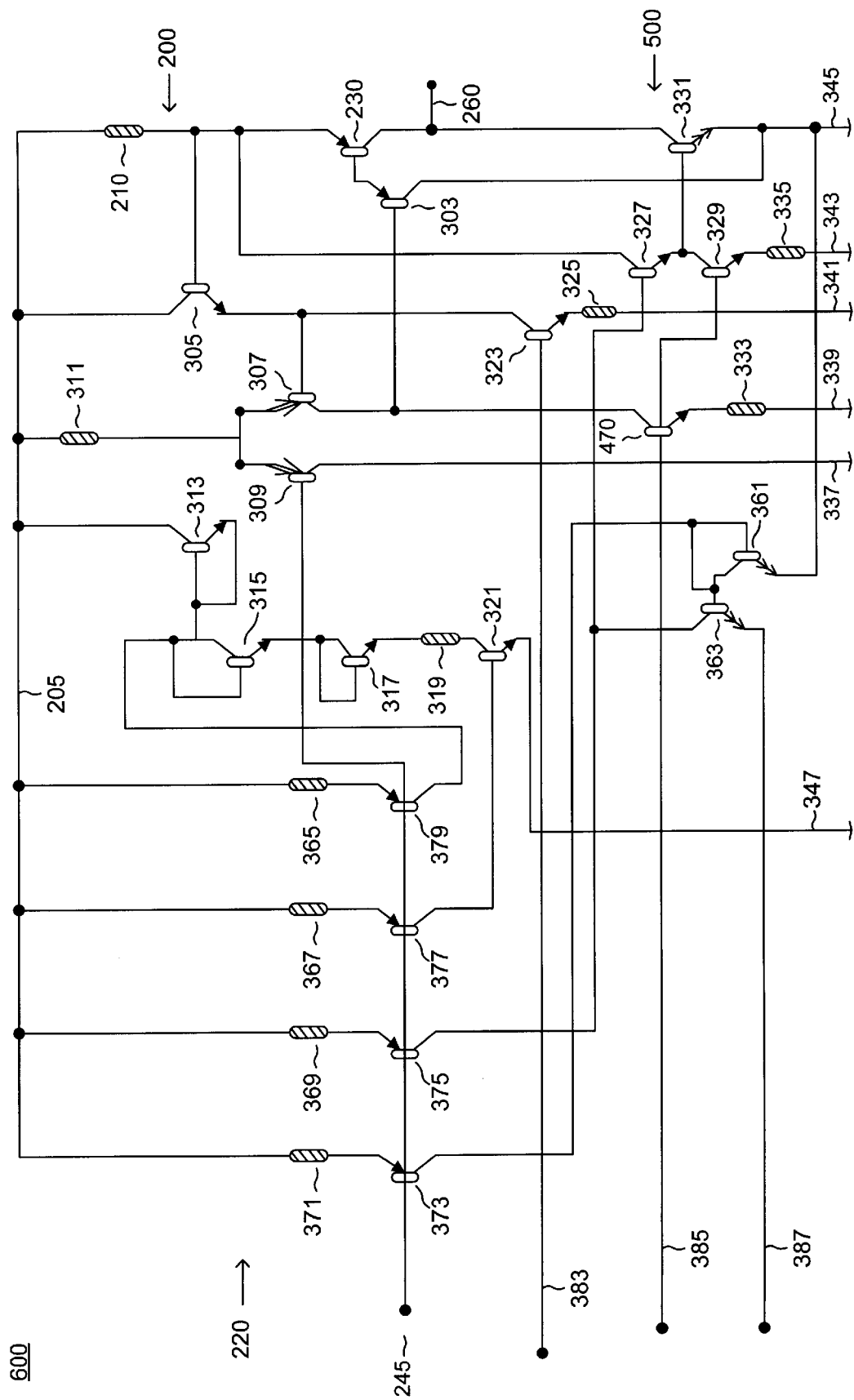
FIG. 5 is a schematic illustrating a first portion of one differential side having the high side current source circuit in accordance with one embodiment of the present invention.
Figure 6:
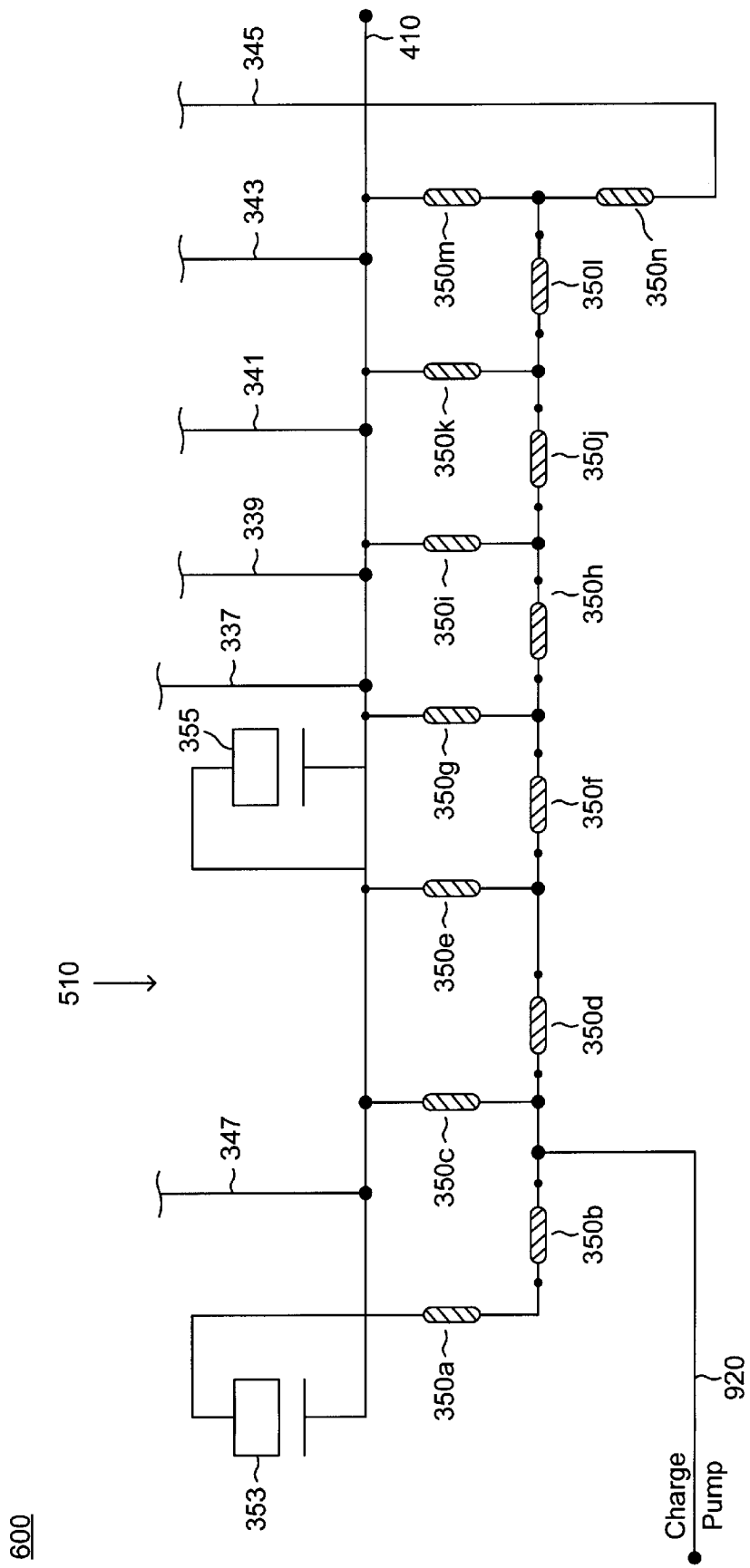
FIG. 6 is a schematic illustrating a second portion of one differential side having the high side current source circuit in accordance with one embodiment of the present invention.
Figure 7:
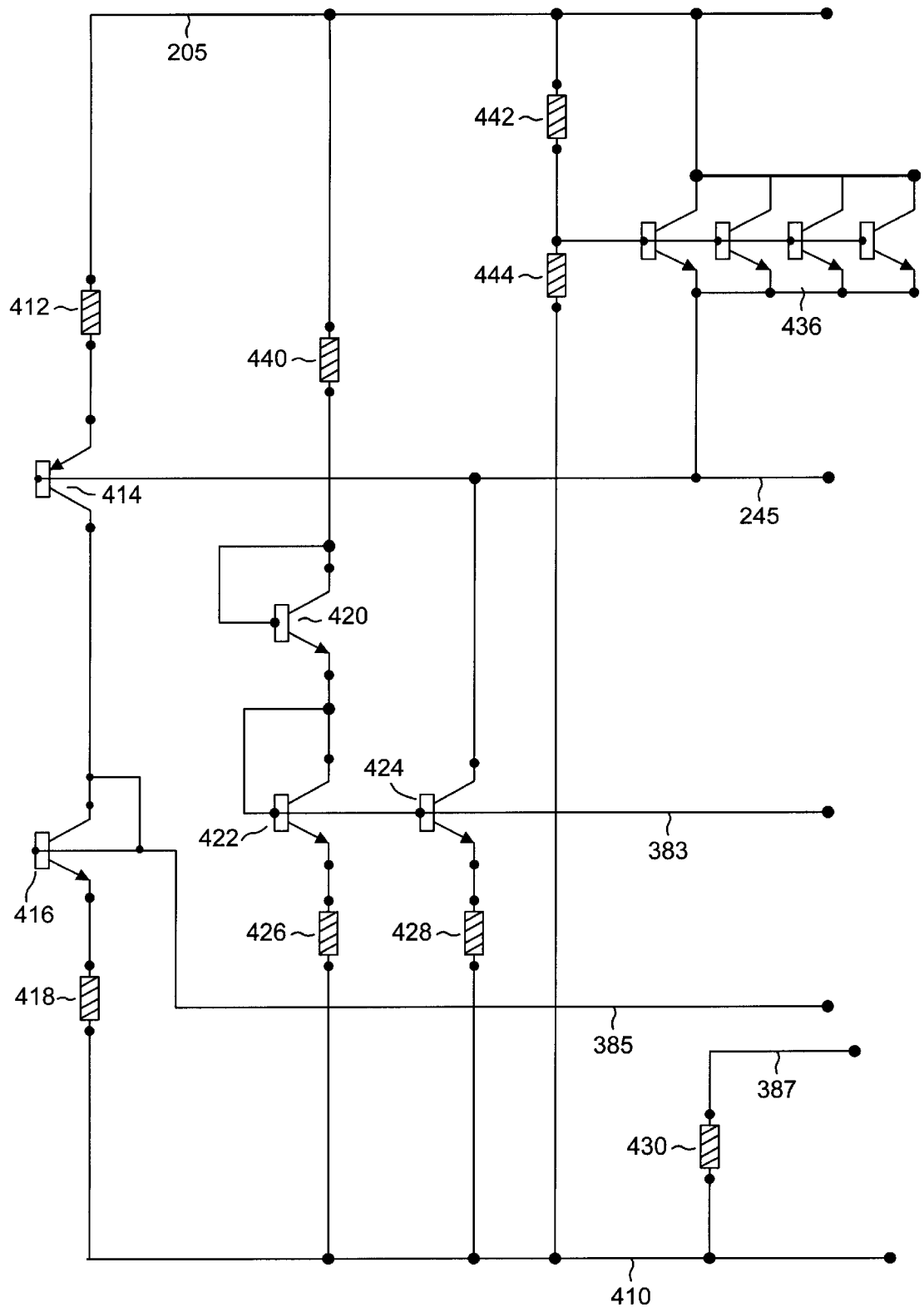
FIG. 7 is a schematic illustrating a third portion of one differential side having the high side current source circuit in accordance with one embodiment of the present invention.

FIG. 5, FIG. 6 and FIG. 7 illustrate the circuitry 600 of one embodiment of a differential side of the clock generation circuit 100 without some of the circuitry of the charge pump (e.g., 810). The circuitry 600 includes a particular embodiment of current source circuit 200 in accordance with the present invention and also includes a current sink 500. Because the current source and sink circuitry for either differential side 130a and 130b are the same, the "a" and "b" labels have been removed from the reference numbers. Specifically, FIG. 6 illustrates a resistor ladder circuit. FIG. 7 illustrates circuitry used generate the Vbias signal over line 245 and other signals used by the operational amplifier circuit 220. FIG. 5 illustrates internal circuitry of the operational amplifier 220 used in accordance with one embodiment of the present invention.

With respect to FIG. 5, the emitter degeneration resistor, RE, 210 is coupled to Vcc 205. Resistor 210 is coupled to the emitter of transistor 230. The positive (+) input of the operational amplifier circuit 220 is represented by line 245 which is coupled to the base of transistor 309. The negative (−) input of operational amplifier circuit 220 is represented by the base of transistor 305 which is coupled to the emitter of transistor 230 in a feedback loop. The output of operational amplifier 220 is taken at the emitter of transistor 303 which is coupled to the base of transistor 230.

The collector of transistor 230 of FIG. 5 is coupled to output node 260 which is coupled to transistor 331. Transistor 331 is coupled to line 345 and also coupled to transistor 303 and to transistor 361. The emitter of transistor 230 is coupled to transistor 327 which is coupled to the base of transistor 331 which is also coupled to transistor 329. Transistor 329 is coupled to resistor 335 which is coupled to line 343. The supply voltage 205 is also coupled to transistor 305 which is coupled to the base of transistor 307 and also coupled to transistor 323. Transistor 323 is coupled to resistor 325 which is coupled to line 341. The supply voltage 205 is coupled to resistor 311 which is coupled to both transistors 309 and 307. Transistor 307 is coupled to the base of transistor 303 and also coupled to transistor 470 which is coupled to resistor 333 which is coupled to line 339.

The base of transistor 470 of FIG. 5 is coupled to line 385 which is also coupled to the base of transistor 329. Transistor 309 is coupled to line 337. The base of transistor 361 is coupled to the emitter of transistor 361 and also coupled to the base of transistor 363 and also coupled to transistor 373. Line 387 is coupled to transistor 363. Transistor 363 is coupled to the base of transistor 327 and also coupled to transistor 375. Line 383 is coupled to the base of transistor 323. Line 347 is coupled to transistor 321. In addition to the base of transistor 309, line 245 is coupled to the bases of transistors 373, 375, 377 and 379.

The supply voltage 205 of FIG. 5 is also coupled to transistor 313. The collector of transistor 313 is coupled to the base of collector 313 and also to the collector of transistor 315 and to the base of transistor 315 and to transistor 379. Transistor 315 is coupled to the collector and base of transistor 317. Transistor 317 is coupled to resistor 319 which is coupled to transistor 321. The supply voltage 205 is also coupled to resistors 371, 369, 367 and 365. Resistor 371 is coupled to transistor 373. Resistor 369 is coupled to transistor 375. Resistor 367 is coupled to transistor 377. Resistor 365 is coupled to transistor 379.

It is appreciated that resistor 311 of FIG. 5 is used between the supply voltage 205 and the emitters of transistors 307 and 309 in lieu of a transistor in an effort to increase the operational (e.g., DC) voltage at the emitters of PNP transistors 309 and 307. In low voltage applications (e.g., where the supply voltage 205 is between 2.0 and 3.3 volts), this arrangement acts to increase the dynamic range of the current source 200 in accordance with the present invention so that the current source can more effectively operate within low voltage environments. The voltage at the emitters of transistor 307 and 309 is a function of the tail current and the bias current.

In addition to the resistor 311, the operational amplifier circuit 220 of the present invention also contains a level shifting circuit to increase the operational voltage at the emitter of transistor 230 to help increase the dynamic range of current source 200 in low voltage environments. The level shifting circuitry includes PNP transistor 307 and NPN transistor 305. There is a 7/10 volt drop from the voltage supply 205 to the base of transistor 307. From the base of transistor 307 there is a 7/10 volt increase to the base of transistor 305 which is also the emitter of transistor 230. This circuit configuration creates a DC level shift to increase the DC voltage at the emitter of transistor 230. This effectively increases the dynamic linear range of operation for the current source 200 in cases when a low voltage power supply is used. It is desired to have the output of the current source 200 swing as large as possible to achieve a low VCO gain for the VCO of FIG. 3B.

FIG. 6 illustrates circuitry of an exemplary resistor ladder that is used as the emitter degeneration resistor 510 for the current sink circuit 500. The circuitry of FIG. 6 is not particularly pertinent to the high output impedance characteristics of the current source 200 of the present invention. Line 345 is coupled to resistor 350n which is coupled to both resistors 350l and 350m. Resistor 350m is coupled to line 343 and resistor 350l is coupled to resistors 350k and 350j. Resistor 350k is coupled to line 341 which is coupled to resistor 350l which is coupled to resistors 350j and 350h. Line 339 is coupled to resistor 350l and resistor 350g which is coupled to resistors 350h and 350f. Line 337 is coupled to resistors 350g and 350e and to capacitor 355. Resistor 350e is coupled to resistors 350f and 350d. Resistor 350d is coupled to resistors 350c and 350b. Resistor 350c is coupled to line 347 which is coupled to capacitor 353 which is coupled to resistor 350a and resistor 350b. Resistors 350b, 350d, 350f, 350h, 350j and 350l are coupled in series. Line 920 is coupled between resistors 350b and 350d.

FIG. 7 illustrates an exemplary circuit for generating the Vbias voltage over line 245. Using a resistor divider technique, Vcc 205 is coupled to resistor 442 which is coupled in series to resistor 444 which is coupled to ground. The node between resistors 442 and 444 is coupled in parallel to the bases of NPN transistors of a buffer circuit 436. The NPN transistors of buffer circuit 436 are also coupled to Vcc 205 and also to line 245. Line 245 is coupled to the base of transistor 414. Buffer circuit 436 makes the Vbias voltage on line 245 less dependent on loading.

Line 245 of FIG. 7 is also coupled to transistor 424 which is coupled to resistor 428 which is coupled to ground. Vcc 205 is coupled to resistor 440 which is coupled to transistor 420 which is coupled to transistor 422 which is coupled to resistor 426 which is coupled to ground. The node between transistors 422 and 420 is coupled to the base of transistors 422 and 424 and supplied as line 383. The node between resistor 440 and transistor 420 is coupled to the base of transistor 420. Node 410 is coupled to resistor 430 and supplied as line 387.

Vcc 205 of FIG. 7 is coupled to resistor 412 which is coupled to transistor 414 which is coupled to transistor 416 which is coupled to resistor 418 which is coupled to ground. The node between transistor 414 and 416 is coupled to the base of transistor 416 and supplied as line 385.

Although a number of different resistor configurations can be used in accordance with the present invention, Table I below illustrates one exemplary resister assignment.

TABLE I

| Resistor | Approximate Resistor Valve (ohms) |
|---|---|
| 210 | 30 k |
| 311 | 30 k |
| 325 | 30 k |
| 335 | 65 k |
| 365 | 60 k |
| 367 | 75 k |
| 369 | 60 k |
| 371 | 75 k |
| 319 | 30 k |
| 333 | 45 k |
| 350 (a, b, d, f, h, j, l and n) | 15 k |
| 350 (c, e, g, i, and k) | 30 k |
| 442 | 3 k |
| 444 | 24 k |
| 440 | 25 k |
| 412 | 60 k |
| 418 | 45 k |
| 426 | 7 k |
| 428 | 27 k |
| 430 | 3 k |

The operation of the circuit implementation 600 of FIG. 5, FIG. 6 and FIG. 7 is described as follows. The emitter degeneration resistor is resistor 210 as shown in FIG. 5. The inverting side of the operational amplifier 220 is formed by transistors 305 and transistor 307. Tail current is provided by resistor 311. A current sink which is half the tail current is provided by transistor 470. The output of the operational amplifier 220 is at the emitter of transistor 303. The non-inverting side of the operational amplifier 220 consists of transistor 305.

With respect to FIG. 7, the Vbias voltage input is formed by the divider consisting of resistors 442 and 444. Resistor 412, transistor 414, transistor 416 and resistor 418 of FIG. 7 provide the bias line 385 for the current source transistor 470 of FIG. 5.

The operational amplifier topology of the present invention is designed to operate within low power supply environments where the power supply voltage, Vcc 205, is low (e.g., 2.0 to 3.3 volts). In one embodiment, the power supply voltage Vcc 205 is 2.7 volts. Low power supply voltage restricts the size of the voltage that can be impressed across resistor 210. This requires that an NPN input stage (transistor 305) be used in the operational amplifier circuit 220. This NPN transistor 305 also provides level shifting so that a PNP input operational amplifier can be used to simplify the resulting circuit 200. This NPN transistor 305 is therefore followed by a PNP transistor 307.

In one embodiment, a resistor 311 is used to supply tail current in lieu of a transistor due to constraints. This current is constant. A current which is half of the tail current is produced by making a replica of the tail current. This is done using resistor 412 and transistor 414 (FIG. 7) and transistor 416 and resistor 416 where resistor 412 is twice the size as resistor 311 (FIG. 5) thereby producing half of the tail current.

The improvement in the output impedance of the circuit 200 of the present invention depends on the gain, A, of the operational amplifier 220. The output impedance of circuit 200 is R"o. The gain of the operational amplifier 220 is determined by the Early voltage of transistor 307 divided by (kT/q), as shown below:

$$Ro"=Early\ Voltage/(kT/q)=Ro(RE*Rpi)(A+1)$$

where k, T and q are well known values defined by the physics of the transistor and where RE is the resistance of resistor RE, Rpi is 1/gm, A is the open loop gain of operational amplifier 220 and Ro is the output impedance of the current source circuit of FIG. 1.

The preferred embodiments of the present invention, a high side, low power, current source having improved output impedance for reducing effects of leakage current, are thus described. While the present invention has been described in particular embodiments, it should be appreciated that the present invention should not be construed as limited by such embodiments, but rather construed according to the below claims.

What is claimed is:

1. A current source circuit comprising:
   an emitter degeneration resistor coupled to the high side of a supply voltage and coupled to a first node, wherein said supply voltage is within the range of 2.0 to 3.3 volts;
   a transistor device comprising:
      an emitter coupled to said first node;
      a collector coupled to an output node; and
      a base, wherein said current source circuit supplies current from said output node;
   an operational amplifier circuit having an output coupled to said base of said transistor device, said operational amplifier circuit also having a first input and a second input, said first input coupled to said first node to provide a feedback loop, said operational amplifier circuit operable to maintain constant any current flowing through said transistor device to provide a high output impedance for said current source circuit, wherein said operational amplifier circuit comprises a level shifting circuit for increasing the dynamic voltage range of said current source circuit by increasing a direct current (DC) voltage at said first node, said level shifting circuit coupled to said first node of said transistor device and comprising:
      a first resistor coupled to said high side of said supply voltage;
      a first transistor having an emitter coupled to said first resistor; and a second transistor coupled to a base of said first transistor and having a base coupled to said first node; and a bias voltage applied to said second input of said operational amplifier circuit.

2. A current source circuit as described in claim 1 wherein said transistor device is a PNP transistor device.

3. A current source circuit as described in claim 1 wherein said emitter degeneration resistor is approximately 30K ohms.

4. A current source circuit as described in claim 1 wherein said first input of said operational amplifier circuit is a negative input and wherein said second input is a positive input.

5. A current source circuit as described in claim 1 wherein said first resistor is approximately 30K ohms.

6. A current source circuit as described in claim 1 wherein said high output impedance of said current source circuit is based on an open loop gain of said operational amplifier circuit.

7. A current source comprising:

an emitter degeneration resistor coupled to the high side of a supply voltage and coupled to a first node, wherein said supply voltage has a voltage level within the range of 2.0 to 3.3 volts;

a transistor means comprising:
an emitter coupled to said first node;
a collector coupled to an output node; and
a base, wherein said current source supplies current from said output node;

an operational amplifier means having an output coupled to said base of said transistor means, said operational amplifier means also having a first input and a second input, said first input coupled to said first node to provide a feedback loop, said operational amplifier means for maintaining constant any current flowing through said transistor means to provide a high output impedance for said current source, wherein said operational amplifier means comprises a level shifting means coupled to said first node of said transistor means, said level shifting means for increasing the dynamic voltage range of said current source by increasing a direct current (DC) voltage at said first node, said level shifting means comprising:

a first resistor coupled to said high side of said supply voltage;

a first transistor having an emitter coupled to said first resistor; and a second transistor coupled to a base of said first transistor and having a base coupled to said first node; and a bias voltage applied to said second input of said operational amplifier means.

8. A current source as described in claim 7 wherein said transistor means is a PNP transistor device.

9. A current source as described in claim 8 wherein said emitter degeneration resistor is approximately 30K ohms.

10. A current source as described in claim 7 wherein said first input of said operational amplifier means is a negative input and wherein said second input is a positive input.

11. A current source as described in claim 7 wherein said first resistor is approximately 30K ohms.

12. A current source as described in claim 7 wherein said high output impedance of said current source is based on an open loop gain of said operational amplifier means.

13. In a phase lock loop circuit of a clock generator circuit, a current source circuit having a stable output current for maintaining a voltage at the input of a voltage controlled oscillator, said current source circuit comprising:

an emitter degeneration resistor coupled to the high side of a supply voltage and coupled to a first node, wherein said supply voltage has a voltage level within the range of 2.0 to 3.3 volts;

a transistor device comprising:
an emitter coupled to said first node;
a collector coupled to an output node; and
a base, wherein said current source circuit supplies current from said output node;

an operational amplifier circuit having an output coupled to said base of said transistor device, said operational amplifier circuit also having a first input and a second input, said first input coupled to said first node to provide a feedback loop, said operational amplifier circuit for maintaining constant any current flowing through said transistor device to provide a high output impedance for said current source circuit, wherein said operational amplifier circuit comprises a level shifting circuit coupled to said first node of said transistor device, said level shifting circuit comprising:

a first resistor coupled to said high side of said supply voltage;

a first transistor having an emitter coupled to said first resistor; and a second transistor coupled to a base of said first transistor and having a base coupled to said first node, said level shifting circuit for increasing the dynamic voltage range of said current source circuit by increasing a direct current (DC) voltage at said first node; and a bias voltage applied to said second input of said operational amplifier circuit.

14. A current source circuit as described in claim 13 wherein said transistor device is a PNP transistor device.

15. A current source circuit as described in claim 13 wherein said emitter degeneration resistor is approximately 30K ohms.

16. A current source circuit as described in claim 13 wherein said first input of said operational amplifier circuit is a negative input and wherein said second input is a positive input.

17. A current source circuit as described in claim 13 wherein said high output impedance of said current source circuit is based on an open loop gain of said operational amplifier circuit.

* * * * *